(12) United States Patent
Takabayashi

(10) Patent No.: US 10,148,190 B2
(45) Date of Patent: Dec. 4, 2018

(54) POWER CONVERSION DEVICE

(71) Applicant: Mitsubishi Electric Corporation, Chiyoda-ku, Tokyo (JP)

(72) Inventor: Hirokazu Takabayashi, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 15/553,641

(22) PCT Filed: Apr. 20, 2015

(86) PCT No.: PCT/JP2015/062019
§ 371 (c)(1),
(2) Date: Aug. 25, 2017

(87) PCT Pub. No.: WO2016/170586
PCT Pub. Date: Oct. 27, 2016

(65) Prior Publication Data
US 2018/0048243 A1    Feb. 15, 2018

(51) Int. Cl.
*H02M 5/458*    (2006.01)
*H02M 1/32*    (2007.01)
(Continued)

(52) U.S. Cl.
CPC ........... *H02M 5/4585* (2013.01); *H02M 1/32* (2013.01); *H02M 5/45* (2013.01); *H02M 5/4505* (2013.01);
(Continued)

(58) Field of Classification Search
CPC .............. H02M 5/4585; H02M 1/32; H02M 2001/322; H02M 5/458; H02M 7/0003
See application file for complete search history.

(56) References Cited

U.S. PATENT DOCUMENTS 6,064,578 A *  5/2000  Hashimoto ........... H02M 7/003
                                                            363/16
9,917,529 B2 *  3/2018  Hattori ................... H02M 7/003
(Continued)

FOREIGN PATENT DOCUMENTS

EP    2 099 117 A2    9/2009
JP    58-133175 A     8/1983
(Continued)

OTHER PUBLICATIONS

Machine English Translation of JP 2010-074994, Apr. 2, 2010.*
(Continued)

*Primary Examiner* — Timothy J Dole
*Assistant Examiner* — Sisay G Tiku
(74) *Attorney, Agent, or Firm* — Buchanan Ingersoll & Rooney PC

(57) ABSTRACT

A power conversion device that constitutes a converter-inverter unit where a converter to convert AC power to DC power and an inverter to convert DC power obtained by conversion of the converter to AC power are connected in series. A capacitor unit including a capacitor cell to accumulate therein the DC power obtained by conversion of the converter is provided between the converter and the inverter. A first conductor electrically connected to one of electrodes of the capacitor cell and a second conductor electrically connected to the other electrode of the capacitor cell are drawn out from the capacitor unit, and the first conductor is connected directly to positive-side capacitor connection terminals and of the converter and positive-side capacitor connection terminals and of the inverter, and the second conductor is connected directly to negative-side capacitor connection terminals and of the converter and negative-side capacitor connection terminals of the inverter.

11 Claims, 6 Drawing Sheets

(51) Int. Cl.
    *H01G 2/02*    (2006.01)
    *H01G 2/06*    (2006.01)
    *H02M 5/45*    (2006.01)
    *H05K 7/20*    (2006.01)
(52) U.S. Cl.
    CPC ... *H05K 7/20909* (2013.01); *H02M 2001/322* (2013.01)

(56) References Cited

U.S. PATENT DOCUMENTS

| | | | |
|---|---|---|---|
| 2006/0208660 | A1 | 9/2006 | Shinmura et al. |
| 2011/0242866 | A1* | 10/2011 | Takizawa .............. H02M 7/487 363/131 |
| 2016/0226396 | A1* | 8/2016 | Hattori .................. H02M 7/003 |
| 2017/0033593 | A1* | 2/2017 | Kamizuma ............... H02J 9/06 |
| 2017/0040906 | A1* | 2/2017 | Hattori .................... H02M 7/48 |

FOREIGN PATENT DOCUMENTS

| | | | |
|---|---|---|---|
| JP | 2767188 | B | 4/1988 |
| JP | 04-289773 | A | 10/1992 |
| JP | 09-219970 | A | 8/1997 |
| JP | 11-103577 | A | 4/1999 |
| JP | 2001-086732 | A | 3/2001 |
| JP | 2002-084766 | A | 3/2002 |
| JP | 2003-250278 | A | 9/2003 |
| JP | 2003-319665 | A | 11/2003 |
| JP | 2004-135444 | A | 4/2004 |
| JP | 2006-262665 | A | 9/2006 |
| JP | 2007-006565 | A | 1/2007 |
| JP | 2007-053839 | A | 3/2007 |
| JP | 2007-068294 | A | 3/2007 |
| JP | 2009-219175 | A | 9/2009 |
| JP | 2010-074994 | A | 4/2010 |
| JP | 2010-193593 | A | 9/2010 |
| JP | 2011-239679 | A | 11/2011 |
| JP | 2012-249501 | A | 12/2012 |
| JP | 5335868 | B2 | 8/2013 |
| JP | 2015-006031 | A | 1/2015 |
| JP | 2015-073376 | A | 4/2015 |

OTHER PUBLICATIONS

International Search Report (PCT/ISA/210) dated Jun. 16, 2015, by the Japanese Patent Office as the International Searching Authority for International Application No. PCT/JP2015/062019.
Written Opinion (PCT/ISA/237) dated Jun. 16, 2015, by the Japanese Patent Office as the International Searching Authority for International Application No. PCT/JP2015/062019.
Notification of Reason for Refusal for Japanese Patent Application No. 2016-558830 dated Dec. 6, 2016.
The extended European Search Report dated Dec. 5, 2017, by the European Patent Office in corresponding European Patent Application No. 15889826.2-1809. (8 pages).
Submission of Publication dated Mar. 26, 2018, corresponding to Japanese Patent Application No. 2017-112783 with English Translation (36 Pages).
Office Action (Notification of Reasons for Refusal) dated Jul. 31, 2018, by the Japanese Patent Office in corresponding Japanese Patent Application No. 2017-112783 and English translation of the Office Action. (9 pages).

\* cited by examiner

POWER CONVERSION DEVICE

FIELD

The present invention relates to a power conversion device that includes a converter and an inverter and has a capacitor between the converter and the inverter.

BACKGROUND

As a terminal connection configuration to connect capacitor terminals to power-transistor module terminals, a method of drawing conductors from a capacitor and directly connecting the conductors to the power-transistor module terminals is known (for example, Patent Literature 1 listed below).

CITATION LIST

Patent Literature

Japanese Patent Publication No. 5335868

SUMMARY

Technical Problem

However, the conventional technique described above is an example of application to an inverter that converts DC power to AC power and is not an example of application to a power conversion device that converts AC power to DC power once and then converts the DC power to AC power again, that is, a power conversion device that performs power conversion twice.

A power conversion device that performs power conversion twice is constituted of a converter that converts AC power to DC power and an inverter that converts DC power obtained by conversion of the converter to AC power, where the converter and the inverter are connected in series. This configuration is sometimes referred to as "CI configuration" using the initial letter "C" of the converter and the initial letter "I" of the inverter, and is hereinafter referred to as "CI configuration".

When the terminal connection configuration according to Patent Literature 1 described above is applied to each of the converter and the inverter in the case of a power conversion device with the CI configuration, a first capacitor connected directly to terminals of switching elements that constitute the converter and a second capacitor connected directly to terminals of switching elements that constitute the inverter are inevitably configured to be electrically connected to each other with a wire. In this configuration, a resonance phenomenon may occur between a wiring inductance of the relevant wire and each of capacitances of the first capacitor and the second capacitor and a phenomenon in which a current may flow back and forth between the first capacitor and the second capacitor, that is, in a DC section through which a DC current flows may occur, which causes a problem of an increase in loss in the DC section. When a separate wire is provided in the DC section, there is also a problem that an overvoltage in the switching elements due to L(dI/dt) is caused by a wiring inductance component L and a temporal change component dI/dt of a DC current I, which may lead to element breakage when the wiring inductance component L is large.

The present invention has been achieved in view of the above problems and an object of the present invention is to provide a power conversion device with the CI configuration, the power conversion device including a capacitor unit that reduces loss in a DC section and has a terminal connection configuration without requiring a separate wire.

Solution to Problem

To solve the above described problems and achieve the object a power conversion device according to the present invention includes a converter including a converter module to convert AC power to DC power, and an inverter including an inverter module to convert DC power obtained by conversion of the converter to AC power, the converter and the inverter being connected in series to constitute a converter-inverter unit. A capacitor unit including a capacitor cell to accumulate therein the DC power obtained by conversion of the converter is provided between the converter and the inverter. A first conductor electrically connected to one of electrodes of the capacitor cell and a second conductor electrically connected to the other electrode of the capacitor cell are drawn out from the capacitor unit. The first conductor is connected directly to a positive-side capacitor connection terminal of the converter module and a positive-side capacitor connection terminal of the inverter module, and the second conductor is connected directly to a negative-side capacitor connection terminal of the converter module and a negative-side capacitor connection terminal of the inverter module.

Advantageous Effects of Invention

According to the present invention, an effect is obtained where, as a power conversion device with the CI configuration, it is possible to provide a power conversion device including a capacitor unit that reduces loss in a DC section and has a terminal connection configuration without requiring a separate wire.

DESCRIPTION OF EMBODIMENTS

Exemplary embodiments of a power conversion device according to the present invention will be explained below in detail with reference to the accompanying drawings. The present invention is not limited to the following embodiments.

First Embodiment

Figure 1:
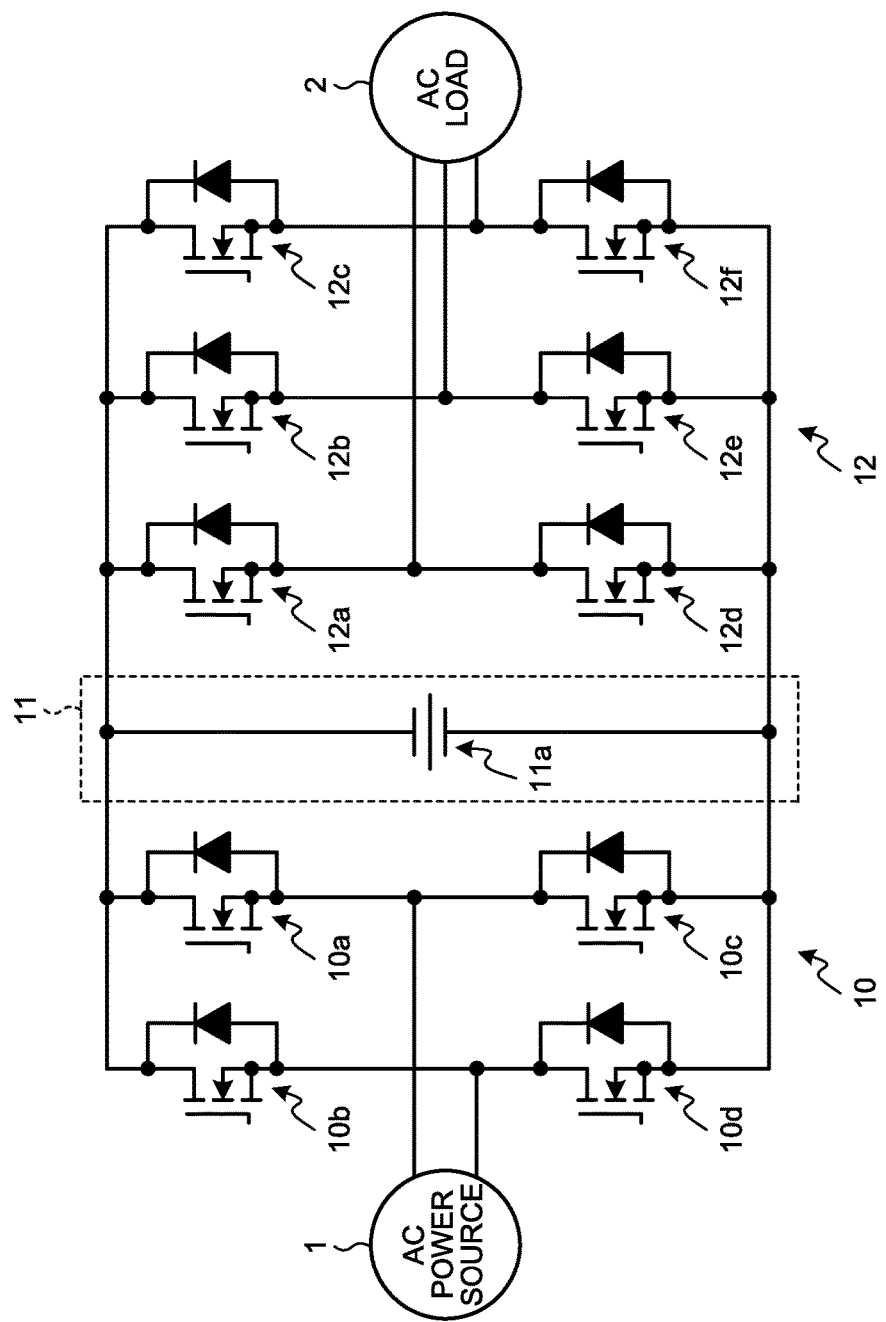
FIG. 1 is a circuit diagram for explaining a power conversion device according to a first embodiment.

FIG. 1 is a circuit diagram for explaining a power conversion device according to a first embodiment. The power conversion device according to the first embodiment includes a converter 10 that converts AC power supplied from an AC power source 1 to DC power, a capacitor unit 11 provided with capacitor cells 11a and accumulates therein the DC power supplied from the converter 10, and an inverter 12 that converts the DC power accumulated in the capacitor unit 11 to AC power and supplies the AC power to an AC load 2, as illustrated in FIG. 1.

The converter 10 has a circuit part (hereinafter, "legs"), in which upper arms constituted by switching elements 10a and 10b (a U phase: 10a, and a V phase: 10b) and lower arms constituted by switching elements 10c and 10d (the U phase: 10c, and the V phase: 10d) are connected in series, respectively. That is, the converter 10 constitutes a single-phase bridge circuit having two legs each leg including the U phase and the V phase.

The converter 10 executes modulation control (Pulse Width Modulation; hereinafter, "PWM control") to vary a pulse width when switching control on the switching elements 10a, 10b, 10c, and 10d is performed, thereby converting an input AC voltage to a desired DC voltage and outputs the DC voltage.

To an output terminal of the converter 10, the capacitor unit 11 serving as a DC power source is connected in parallel; and also the inverter 12 that receives a DC voltage of the capacitor unit 11 as an input and converts the DC voltage to an AC voltage at an arbitrary voltage and an arbitrary frequency to output the AC voltage is connected.

The inverter 12 has legs, in which upper arms constituted by switching elements 12a, 12b, and 12c (the U phase: 12a, the V phase: 12b, and a W phase: 12c) and lower arms constituted by switching elements 12d, 12e, and 12f (the U phase: 12d, the V phase: 12e, and the W phase: 12f) are connected in series, respectively. That is, the inverter 12 constitutes a three-phase bridge circuit having three legs each including the U phase, the V phase, and the W phase.

The inverter 12 executes PWM control on the switching elements 12a, 12b, 12c, 12d, 12e, and 12f to convert the input DC voltage to a desired AC voltage and outputs the AC voltage.

A configuration of relevant parts of the power conversion device according to the first embodiment will be described next with reference to FIGS. 2 to 4.

Figure 2:
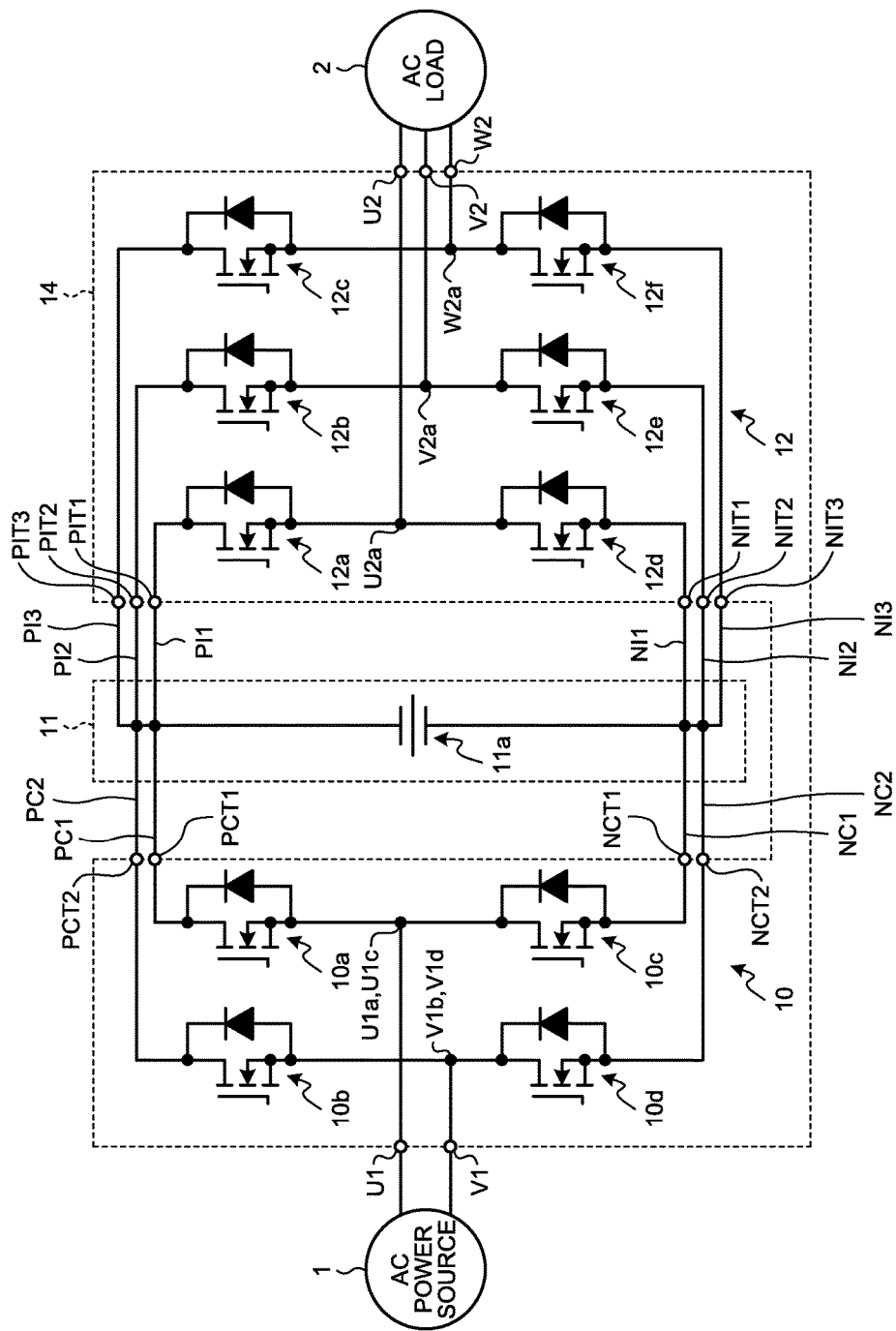
FIG. 2 is a diagram of constituent segments of the power conversion device according to the first embodiment, illustrated on the circuit diagram of FIG. 1.

FIG. 2 is a diagram of constituent segments of the power conversion device according to the first embodiment, illustrated on the circuit diagram of FIG. 1. The power conversion device according to the first embodiment is constituted by a converter-inverter unit (hereinafter, "CI unit") 14, in which the converter 10 that converts AC power to DC power and the inverter 12 that converts the DC power obtained by conversion of the converter 10 to AC power are connected in series as illustrated in FIG. 2. The CI unit 14 includes: first input-output terminals U1 and V1 that are AC terminals of the converter 10 and form electrical connection terminals to the AC power source 1 to transfer AC power to and from the AC power source 1; positive-side capacitor connection terminals PCT1 and PCT2 that form electrical connection terminals of the converter 10 to a positive side of the capacitor unit 11; negative-side capacitor connection terminals NCT1 and NCT2 that form electrical connection terminals of the converter 10 to a negative side of the capacitor unit 11; second input-output terminals U2, V2, and W2 that are AC terminals of the inverter 12 and form electrical connection terminals to the AC load 2 to transfer AC power to and from the AC load 2; positive-side capacitor connection terminals PIT1, PIT2, and PIT3 that form electrical connection terminals of the inverter 12 to the positive side of the capacitor unit 11; and negative-side capacitor connection terminals NIT1, NIT2, and NIT3 that form electrical connection terminals of the inverter 12 to the negative side of the capacitor unit 11.

The positive-side capacitor connection terminals PCT1 and PCT2 are high-potential side terminals. The positive-side capacitor connection terminal PCT1 is drawn out from the switching element 10a provided on the upper arm side and the positive-side capacitor connection terminal PCT2 is drawn out from the switching element 10b provided on the upper arm side. The negative-side capacitor connection terminals NCT1 and NCT2 are low-potential side terminals. The negative-side capacitor connection terminal NCT1 is drawn out from the switching element 10c provided on the lower arm side and the negative-side capacitor connection terminal NCT2 is drawn out from the switching element 10d provided on the lower arm side.

The inverter 12 is configured in a similar manner as the converter 10. That is, the positive-side capacitor connection terminals PIT1, PIT2, and PIT3 are high-potential side terminals. The positive-side capacitor connection terminal PIT1 is drawn out from the switching element 12a located on the upper arm side; the positive-side capacitor connection terminal PIT2 is drawn out from the switching element 12b located on the upper arm side; and the positive-side capacitor connection terminal PIT3 is drawn out from the switching element 12c located on the upper arm side. The negative-side capacitor connection terminals NIT1, NIT2, and NIT3 are low-potential side terminals. The negative-side capacitor connection terminal NIT1 is drawn out from the switching element 12d located on the lower arm side; the negative-side capacitor connection terminal NIT2 is drawn out from the switching element 12e located on the lower arm side; and the negative-side capacitor connection terminal NIT3 is drawn out from the switching element 12f located on the lower arm side.

Connection conductors PC1 and PC2 for electrically connecting positive terminals of the capacitor cells 11a to the positive-side capacitor connection terminals PCT1 and PCT2 of the converter 10 are drawn out from the capacitor unit 11. The connection conductor PC1 is a conductor for a connection to the positive-side capacitor connection terminal PCT1 and the connection conductor PC2 is a conductor for a connection to the positive-side capacitor connection terminal PCT2. The negative side of the capacitor cells 11a is configured similarly as the positive side and connection conductors NC1 and NC2 for electrically connecting negative terminals of the capacitor cells 11a to the negative-side capacitor connection terminals NCT1 and NCT2 of the converter 10 are drawn out therefrom. The connection conductor NC1 is a conductor for a connection to the negative-side capacitor connection terminal NCT1 and the connection conductor NC2 is a conductor for a connection to the negative-side capacitor connection terminal NCT2.

Connection conductors PI1, PI2, and PI3 for electrically connecting the positive terminals of the capacitor cells 11a to the positive-side capacitor connection terminals PIT1, PIT2, and PITS of the inverter 12 are also drawn out from the capacitor unit 11. The connection conductor PI1 is a conductor for a connection to the positive-side capacitor connection terminal PIT1, the connection conductor PI2 is a conductor for a connection to the positive-side capacitor connection terminal PIT2, and the connection conductor PI3 is a conductor for a connection to the positive-side capacitor connection terminal PIT3. The negative side of the capacitor cells 11a is configured similarly as the positive side and connection conductors NI1, NI2, and NI3 for electrically connecting the negative terminals of the capacitor cells 11a to the negative-side capacitor connection terminals NIT1, NIT2, and NIT3 of the inverter 12 are drawn out therefrom. The connection conductor NI1 is a conductor for a connection to the negative-side capacitor connection terminal NIT1, the connection conductor NI2 is a conductor for a connection to the negative-side capacitor connection terminal NIT2, and the connection conductor NI3 is a conductor for a connection to the negative-side capacitor connection terminal NIT3.

Figure 3:
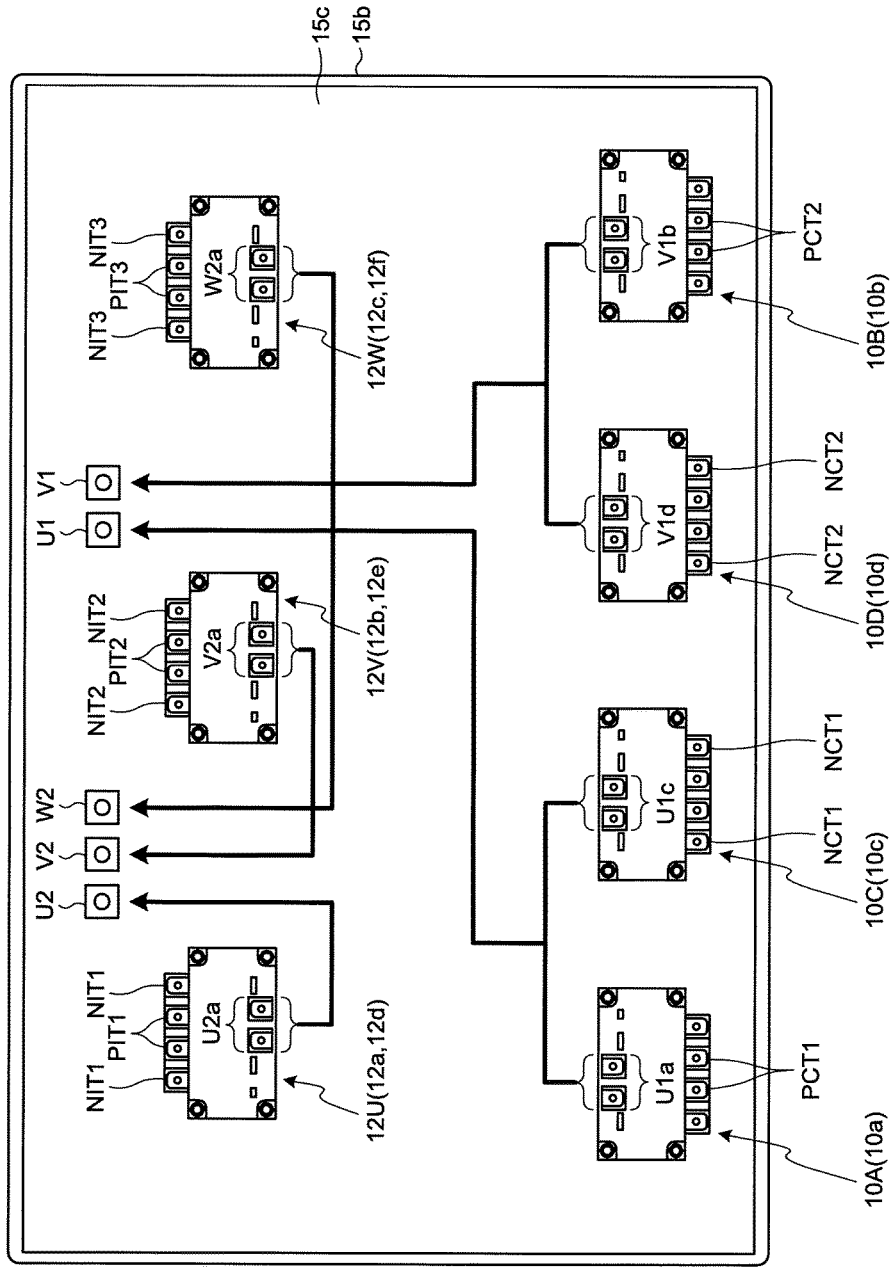
FIG. 3 is a plan view illustrating a placement example of converter modules and inverter modules according to the first embodiment.

FIG. 3 is a plan view illustrating a placement example of converter modules and inverter modules according to the first embodiment. In the first embodiment, as illustrated in FIG. 3, inverter modules 12U, 12V, and 12W are placed in a line in the order of 12U, 12V, and 12W; and converter modules 10A, 10B, 10C, 10D are placed in a line in the order of 10A, 10C, 10D, and 10B on a semiconductor-element mounting surface 15c of a cooler base unit 15b, which will be described later.

Each of the inverter modules 12U, 12V, and 12W is a module with two elements (hereinafter, "2 in 1 module"), which has two switching elements and two diodes mounted on one module. This is described specifically with reference to the configuration illustrated in FIG. 2. In the inverter module 12U, the switching element 12a on the U-phase upper arm and the switching element 12d on the U-phase lower arm are sealed in one module. Similarly, in the inverter module 12V, the switching element 12b on the V-phase upper arm and the switching element 12e on the V-phase lower arm are sealed in one module. In the inverter module 12W, the switching element 12c on the W-phase upper arm and the switching element 12f on the W-phase lower arm are sealed in a module.

Meanwhile, each of the converter modules 10A, 10B, 10C, and 10D is a module with one element (hereinafter, "1 in 1 module"), which has one switching element and one diode mounted on one module. This is described with reference to the configuration of FIG. 2. The switching element 10a on the U-phase upper arm is sealed in the converter module 10A, the switching element 10b on the V-phase upper arm is sealed in the converter module 10B, the switching element 10c on the U-phase lower arm is sealed in the converter module 10C, and the switching element 10d on the V-phase lower arm is sealed in the converter module 10D.

The converter module 10A has the positive-side capacitor connection terminal PCT1 and a connection terminal U1a illustrated also in the circuit diagram of FIG. 2. Similarly, the converter module 10B has the positive-side capacitor connection terminal PCT2 and a connection terminal V1b, the converter module 10C has the negative-side capacitor connection terminal NCT1 and a connection terminal U1c, and the converter module 10D has the negative-side capacitor connection terminal NCT2 and a connection terminal V1d.

The inverter module 12U has the positive-side capacitor connection terminal PIT1, the negative-side capacitor connection terminal NIT1, and a connection terminal U2a illustrated also in the circuit diagram of FIG. 2. Similarly, the inverter module 12V has the positive-side capacitor connection terminal PIT2, the negative-side capacitor connection terminal NIT2, and a connection terminal V2a; and the inverter module 12W has the positive-side capacitor connection terminal PIT3, the negative-side capacitor connection terminal NIT3, and a connection terminal W2a.

In the converter modules 10A, 10B, 10C, and 10D and the inverter modules 12U, 12V, and 12W; the connection conductors PC1 and PC2 drawn out from the capacitor unit 11 are connected directly to the positive-side capacitor connection terminals PIT1, PIT2, and PIT3; and the connection conductors NC1 and NC2 drawn out from the capacitor unit 11 are connected directly to the negative-side capacitor connection terminals NIT1, NIT2, and NIT3.

On the other hand, the connection terminals U1a, V1b, U1c, and V1d in the converter modules 10A, 10B, 10C, and 10D are electrically wired to the first input-output terminals U1 and V1 provided on the semiconductor-element mounting surface 15c, which are illustrated also in the circuit diagram of FIG. 2. That is, the connection terminals U1a, V1b, U1c, and V1d are not terminals connected directly to the AC power source 1 and connections thereof to the AC power source 1 are performed via the first input-output terminals U1 and V1, respectively.

The same holds true for the inverter modules 12U, 12V, and 12W. The connection terminals U2a, V2a, and W2a in the inverter modules 12U, 12V, and 12W are electrically wired to the second input-output terminals U2, V2, and W2 provided on the semiconductor-element mounting surface 15c, which are illustrated also in the circuit diagram of FIG. 2, and connections thereof to the AC load 2 are performed via the second input-output terminals U2, V2, and W2, respectively.

While the inverter modules 12U, 12V, and 12W are configured as the 2 in 1 modules and the converter modules 10A, 10B, 10C, and 10D are configured as the 1 in 1 modules in the configuration of FIG. 3, the present embodiment is not limited to these configurations. For example, the switching elements 10a and 10c may be sealed in one module and the switching elements 10b and 10d may be sealed in one module to constitute 2 in 1 modules in the converter 10, or each of the switching elements 12a, 12b, 12c, 12d, 12e, and 12f may be constituted as a 1 in 1 module. Furthermore, in a small-capacity power conversion device, all the switching elements 10a, 10b, 10c, and 10d may be sealed in one module to constitute a 4 in 1 module or all the switching elements 12a, 12b, 12c, 12d, 12e, and 12f may be sealed in one module to constitute a 6 in 1 module.

Figure 4:
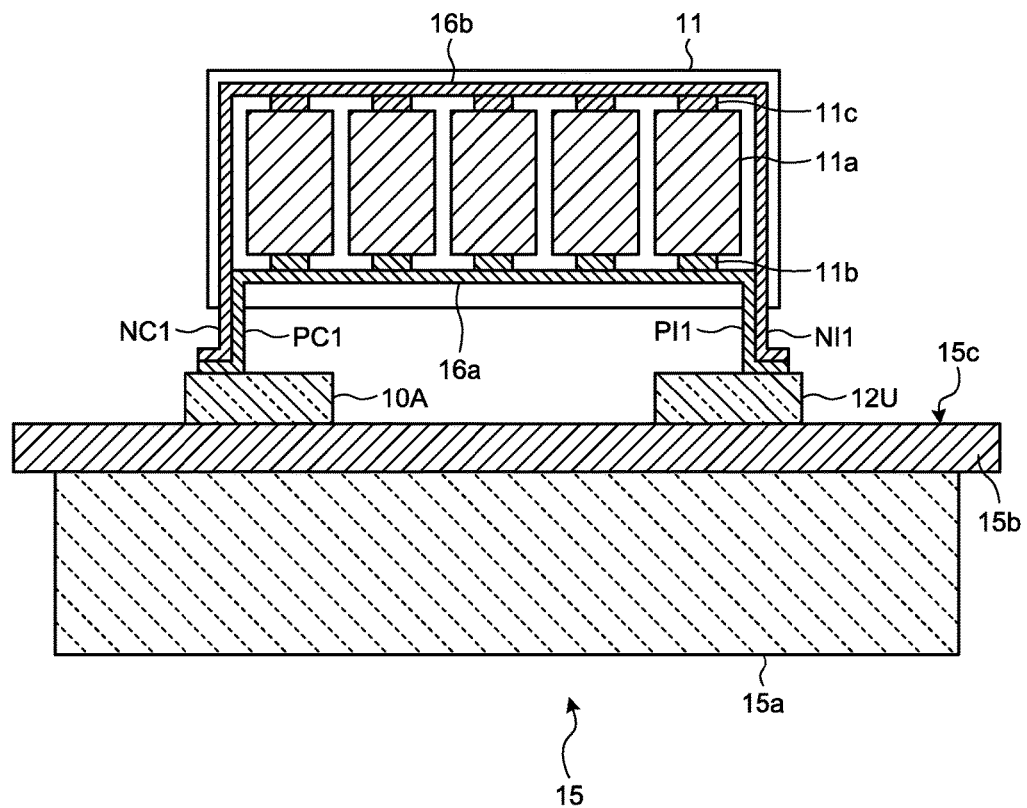
FIG. 4 is a sectional view illustrating a structure example of a capacitor unit according to the first embodiment.

While the converter modules 10A, 10B, 10C, and 10D and the inverter modules 12U, 12V, and 12W are mounted on the semiconductor-element mounting surface 15c of the cooler base unit 15b being the same substrate in FIG. 3, these modules may be mounted on different substrates as long as: a first conductor 16a, illustrated in FIG. 4, drawn out from the capacitor unit 11 is connected to the positive-side capacitor connection terminals of the converter modules and the inverter modules; and a second conductor 16b, illustrated in FIG. 4, drawn out from the capacitor unit is connected to the negative-side capacitor connection terminals of the converter modules and the inverter modules.

FIG. 4 is a sectional view illustrating a first structure example of the capacitor unit according to the first embodiment. FIG. 4 illustrates a sectional shape including the converter module 10A and the inverter module 12U in the placement example of the converter modules and the inverter modules illustrated in FIG. 3. FIG. 4 also illustrates a configuration of a cooler 15 that has mounted thereon the converter module 10A and the inverter module 12U to which the capacitor unit 11 is connected, and that cools the converter module 10A and the inverter module 12U.

In the capacitor unit 11 according to the first structure example, five capacitor cells 11a are placed in a line as illustrated, positive terminals 11b that form one electrode of the capacitor cells 11a are electrically connected in an inner part of the capacitor unit 11 with the first conductor 16a being a plate-like conductor, and negative terminals 11c that form the other electrode of the capacitor cells 11a are similarly electrically connected in the inner part of the capacitor unit 11 with the second conductor 16b being a plate-like conductor.

The cooler 15 includes the cooler base unit 15b and a cooler radiation unit 15a provided to the cooler base unit 15b. The switching elements 10a and 12a included in the CI unit 14 are mounted on the semiconductor-element mounting surface 15c of the cooler base unit 15b. The switching elements 10a and 12a mounted on the semiconductor-element mounting surface 15c are cooled down by cooling air that passes through the cooler radiation unit 15a.

The first conductor 16a is drawn out to an outer part of the capacitor unit 11 on the side of the converter module 10A to constitute the connection conductor PC1 described above, and also is drawn out to an outer part of the capacitor unit 11 on the side of the inverter module 12U to constitute the connection conductor PI1 described above.

Similarly, the second conductor 16b is drawn out to the outer part of the capacitor unit 11 on the side of the converter module 10A to constitute the connection conductor NC1 described above, and also is drawn out to the outer part of the capacitor unit 11 on the side of the inverter module 12U to constitute the connection conductor NI1 described above. While the first conductor 16a and the second conductor 16b are placed to form a stacked layer structure in FIG. 4, it is needless to mention that an insulating sheet is inserted between the first conductor 16a and the second conductor 16b to provide electrical insulation in this configuration.

As described above, the connection conductor PC1 is connected directly to the positive-side capacitor connection terminal PCT1 of the converter module 10A and the connection conductor PI1 is connected directly to the positive-side capacitor connection terminal PIT1 of the inverter module 12U. The connection conductor NI1 is electrically connected to the negative-side capacitor connection terminal NIT1 of the inverter module 12U with a known terminal connection structure. The connection conductor NC1 is not electrically connected to the terminals of the converter module 10A and is electrically connected to the negative-side capacitor connection terminal NCT1 of the converter module 10C as described above.

Figure 5:
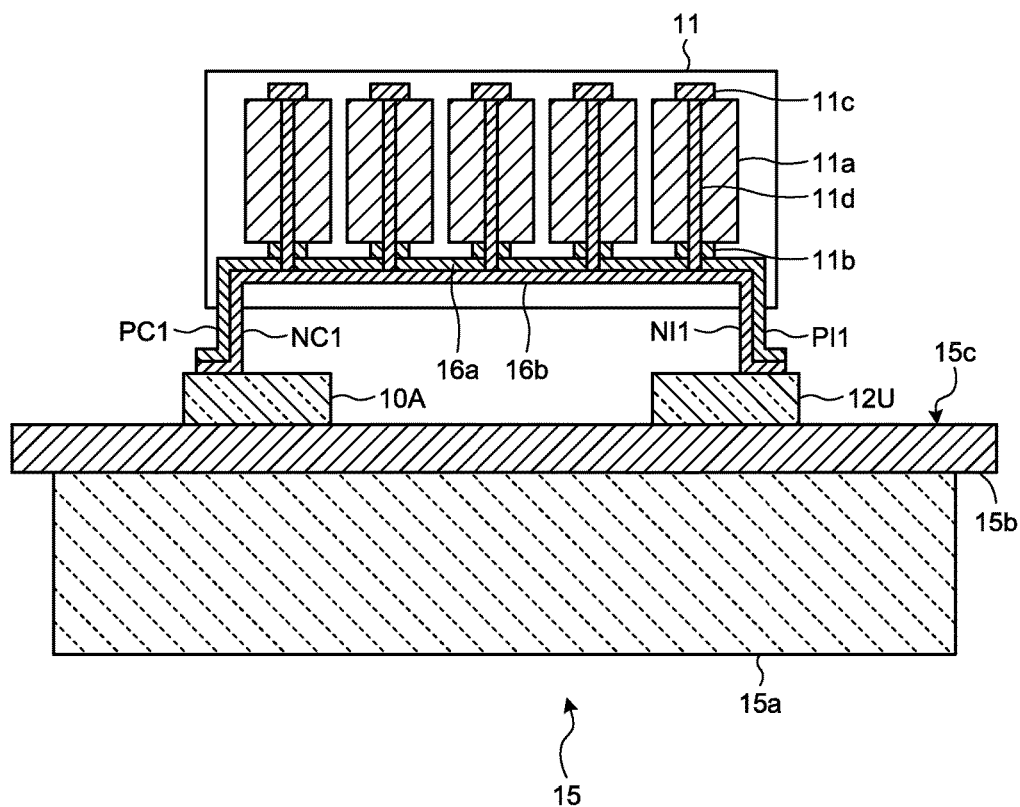
FIG. 5 is a sectional view illustrating a second structure example of the capacitor unit according to the first embodiment, which is different from that illustrated in FIG. 4.

FIG. 5 is a sectional view illustrating a second structure example of the capacitor unit according to the first embodiment, which is different from that illustrated in FIG. 4. While the negative terminals 11c are placed on upper parts of the capacitor cells 11a and the positive terminals 11b are placed on lower parts thereof in the capacitor unit 11 according to the first structure example illustrated in FIG. 4, the negative terminals 11c and the second conductor 16b are electrically connected with conductors 11d passing through inner parts of the capacitor cells 11a in the capacitor unit 11 according to the second structure example illustrated in FIG. 5. With this configuration, the first conductor 16a and the second conductor 16b are placed in parallel both in the inner part and the outer part of the capacitor unit 11. In this case, a current flowing through the first conductor 16a and a current flowing through the second conductor 16b have the same magnitude and opposite flow directions when the switching elements perform a switching operation.

Therefore, the longer a portion in which the first conductor 16a and the second conductor 16b are placed in parallel becomes, the larger an inductance reduction effect becomes. Accordingly, in the capacitor unit 11 according to the second structure example, the wiring inductance is smaller than that in the capacitor unit 11 according to the first structure example.

The capacitor unit 11 is supported by the first conductor 16a and the second conductor 16b in the configurations illustrated in FIGS. 4 and 5. However, when the capacitor unit 11 cannot be supported only by the first conductor 16a and the second conductor 16b in a case where the capacitor unit 11 is weighty or a case where the thicknesses of the first conductor 16a and the second conductor 16b are thinned to reduce the weight, it suffices to adopt a configuration in which a structure, which houses therein the capacitor unit 11, fixes the capacitor unit 11 or a support frame provided on a side part of the capacitor unit 11 fixes the capacitor unit 11.

Effects unique to the power conversion device according to the first embodiment will be described next.

First, in the terminal connection structure of the power conversion device according to the first embodiment, the first conductor 16a drawn out from the capacitor unit 11 is connected directly to the converter modules and the second conductor 16b drawn out from the capacitor unit 11 is connected directly to the inverter modules in the power conversion device of the CI configuration. Therefore, the wiring distance can be reduced and thus wiring at a lower inductance can be achieved as compared to conventional techniques.

Furthermore, in the terminal connection structure according to the first embodiment, the power conversion device of the CI configuration may be configured with a single capacitor unit and it is unnecessary to provide a capacitor unit or a capacitor to each of a converter and an inverter. Therefore, occurrence of a resonance phenomenon between a first capacitor provided on the converter side and a second capacitor provided on the inverter side can be suppressed. Because a current that is likely to flow back and forth between the first capacitor and the second capacitor, that is, in the DC section of the power conversion device can be decreased, loss in the DC section can be reduced. Furthermore, the number of capacitors can be reduced as compared to conventional techniques, which eliminates the need for wiring between the first capacitor and the second capacitor and thus a reduction in the manufacturing cost becomes possible.

For recent power conversion devices, a use of a semiconductor element (SiC element) made of silicon carbide (SiC) has been studied depending on applications. The SiC element has better properties such as a larger heat transfer rate, being capable of operating at higher temperatures, and being capable of higher-speed switching than a semiconductor element made of silicon (Si). Meanwhile, the SiC element has a larger temporal change rate of a switching current flowing through internal wires of a power conversion device because the higher-speed switching is possible. Therefore, a surge voltage occurring in the wires is large and a surge voltage applied to internal components of the power conversion device is increased. Accordingly, a low inductance is required when the SiC element is used. Because the terminal connection structure according to the first embodiment can realize a low inductance and can reduce the surge voltage applied to the internal components of the power conversion device, this structure is particularly useful for a power conversion device to which the SiC element is applied.

Because the SiC element is capable of operating at higher temperatures, the cooler 15 can be reduced in the size. When the size of the cooler 15 can be reduced, the distances between the converter modules and the inverter modules mounted on the semiconductor-element mounting surface 15c of the cooler 15 are reduced, which favorably works on a reduction in the inductance of connection wiring.

SiC is an example of semiconductors called "wide bandgap semiconductor" in view of a property that the bandgap is larger than that of Si (in contrast thereto, Si is called "narrow bandgap semiconductor"). In addition to SiC, a semiconductor made of, for example, a gallium nitride-based material or diamond also belongs to the wide bandgap semiconductors and the properties thereof have many similar points to that of silicon carbide. Therefore, configurations using wide bandgap semiconductor elements other than SiC are also included in the gist of the present invention.

Second Embodiment

Figure 6:
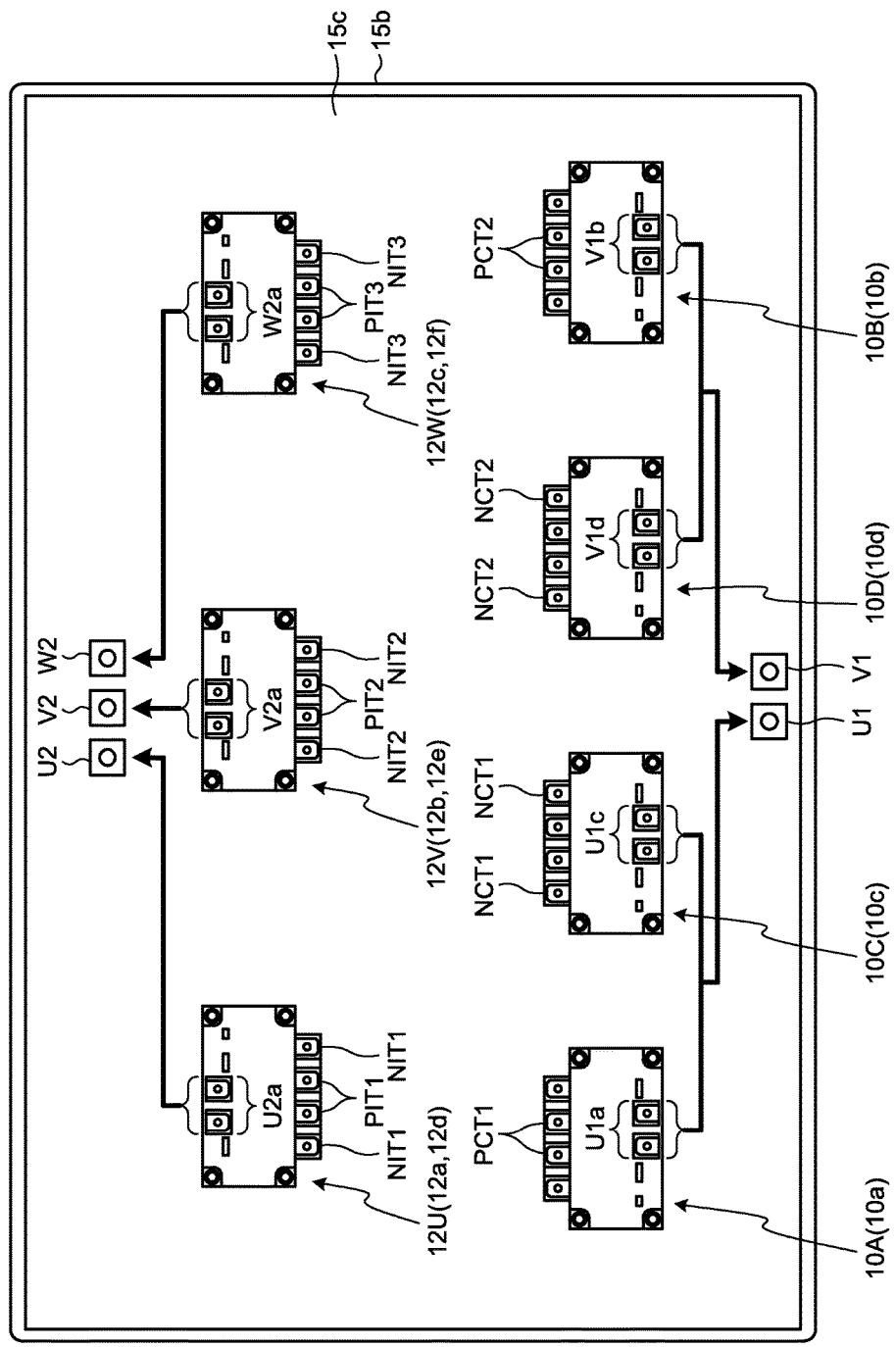
FIG. 6 is a plan view illustrating a placement example of converter modules and inverter modules according to a second embodiment.

In a second embodiment, a variation of the placement of converter modules and inverter modules will be described. FIG. 6 is a plan view illustrating a placement example of converter modules and inverter modules according to the second embodiment. In FIG. 3, the converter modules 10A, 10B, 10C, and 10D and the inverter modules 12U, 12V, and 12W are placed in such a manner that the connection terminals U1a, U1c, V1b, and V1d of the converter modules face the connection terminals U2a, V2a, and W2a of the inverter modules on the mounting surface. In FIG. 6, in contrast thereto, the converter modules 10A, 10B, 10C, and 10D and the inverter modules 12U, 12V, and 12W are placed in such a manner that the connection terminals U1a, U1c, V1b, and V1d of the converter modules and the connection terminals U2a, V2a, and W2a of the inverter modules face outward of the substrate. In other words, the converter modules 10A, 10B, 10C, and 10D and the inverter modules 12U, 12V, and 12W are placed in such a manner that the positive-side capacitor connection terminals PCT1 and PCT2 and the negative-side capacitor connection terminals NCT1 and NCT2 of the converter modules face the positive-side capacitor connection terminals PIT1, PIT2, and PIT3 and the negative-side capacitor connection terminals NIT1, NIT2, and NIT3 of the inverter modules on the mounting surface.

In the case of the configuration illustrated in FIG. 6, the distances between the first input-output terminals U1 and V1 and the connection terminals U1a, V1b, U1c, and V1d of the converter modules 10A, 10B, 10C, and 10D are shorter than those in FIG. 3 and accordingly the lengths of wiring member can be shortened.

The same holds true for the inverter modules 12U, 12V, and 12W. The distances between the second input-output terminals U2, V2, and W2 and the connection terminals U2a, V2a, and W2a of the inverter modules 12U, 12V, and 12W are shorter than those in FIG. 3 and therefore the lengths of wiring components can be shortened.

In the case of the configuration illustrated in FIG. 6, the distances between the positive-side capacitor connection terminals PCT1 and PCT2 and the negative-side capacitor connection terminals NCT1 and NCT2 in the converter modules 10A, 10B, 10C, and 10D and the positive-side capacitor connection terminals PIT1, PIT2, and PIT3 and the negative-side capacitor connection terminals NIT1, NIT2, and NIT3 of the inverter modules 12U, 12V, and 12W are shorter. Accordingly, when the capacitance of the capacitor cells 11a is small and the size of the capacitor unit 11 is small, the lengths of the first conductor 16a and the second conductor 16b drawn out from the capacitor unit 11 can be reduced. This advantageously works on a reduction in the wiring inductance. To the contrary, when the capacitance of the capacitor cells 11a is large and the size of the capacitor unit 11 is large, the configuration illustrated in FIG. 3 may be more advantageous.

The converter modules 10A, 10B, 10C, and 10D and the inverter modules 12U, 12V, and 12W are placed in such a manner that the connection terminals U1a, U1c, V1b, and V1d of the converter modules face the connection terminals U2a, V2a, and W2a of the inverter modules on the mounting surface in FIG. 3. The converter modules 10A, 10B, 10C, and 10D and the inverter modules 12U, 12V, and 12W are placed in such a manner that the positive-side capacitor connection terminals PCT1 and PCT2 and the negative-side capacitor connection terminals NCT1 and NCT2 of the converter modules face the positive-side capacitor connection terminals PIT1, PIT2, and PIT3 and the negative-side capacitor connection terminals NIT1, NIT2, and NIT3 of the inverter modules on the mounting surface in FIG. 6. However, modules on either side in either one of FIGS. 3 and 6 may be inversely placed.

That is, the converter modules 10A, 10B, 10C, and 10D and the inverter modules 12U, 12V, and 12W may be placed in such a manner that the positive-side capacitor connection terminals PCT1 and PCT2 and the negative-side capacitor connection terminals NCT1 and NCT2 of the converter modules face the connection terminals U2a, V2a, and W2a of the inverter modules on the mounting surface. Inversely with this placement, the converter modules 10A, 10B, 10C, and 10D and the inverter modules 12U, 12V, and 12W may be placed in such a manner that the connection terminals U1a, U1c, V1b, and V1d of the converter modules face the positive-side capacitor connection terminals PIT1, PIT2, and PIT3 and the negative-side capacitor connection terminals NIT1, NIT2, and NIT3 of the inverter modules on the mounting surface.

While the power conversion device and the terminal connection configuration thereof according to the first and second embodiments have been described above, the contents described above are only examples of the present invention. It is needless to mention that these contents can be realized while modifying them without departing from the scope of the invention, such as omitting a part of the contents.

REFERENCE SIGNS LIST

1 AC power source
2 AC load
10 converter
10A, 10B, 10C, 10D converter module
10a, 10b, 10c, 10d, 12a, 12b, 12c, 12d, 12e, 12f switching element
11 capacitor unit
11a capacitor cell
11b positive terminal
11c negative terminal
11d conductor
12 inverter
12U, 12V, 12W inverter module
14 CI unit
15 cooler
15a cooler radiation unit
15b cooler base unit
15c semiconductor-element mounting surface
16a first conductor
16b second conductor
PC1, PC2, NC1, NC2, PI1, PI2, PI3, NI1, NI2, NI3 connection conductor PCT1, PCT2, PIT1, PIT2, PIT3 positive-side capacitor connection terminal
NCT1, NCT2, NIT1, NIT2, NITS negative-side capacitor connection terminal
U1, V1 first input-output terminal
U2, V2, W2 second input-output terminal
U1a, V1b, U1c, V1d, U2a, V2a, W2a connection terminal

The invention claimed is:

1. A power conversion device comprising converter including a converter module to convert AC power to DC power, and an inverter including an inverter module to convert DC power obtained by conversion of the converter to AC power, the converter and the inverter being connected in series to constitute a converter-inverter unit, wherein the power conversion device includes:
   a capacitor unit including a capacitor cell to accumulate therein the DC power obtained by conversion of the converter provided between the converter and the inverter;
   a first conductor directly connected inside the capacitor unit to one of electrodes of the capacitor cell, and terminal ends of the first conductor are respectively positioned at outside of the capacitor unit and are connected to a positive-side capacitor connection terminal of the converter module and a positive-side capacitor connection terminal of the inverter module; and
   a second conductor directly connected inside the capacitor unit to the other electrode of the capacitor cell, and terminal ends of the second conductor are respectively positioned at outside of the capacitor unit and are connected to a negative-side capacitor connection terminal of the converter module and a negative-side capacitor connection terminal of the inverter module respectively, wherein
   when switching elements provided in the converter module or in the inverter module perform a switching operation, a DC current flows via the terminal ends of the first conductor or the terminal ends of the second conductor.

2. The power conversion device according to claim 1, wherein the first conductor and the second conductor are drawn out to outside of the capacitor unit,
   the first conductor drawn out to outside of the capacitor unit is connected directly to the positive-side capacitor connection terminal of the converter module and the positive-side capacitor connection terminal of the inverter module, and
   the second conductor drawn out to outside of the capacitor unit is connected directly to the negative-side capacitor connection terminal of the converter module and the negative-side capacitor connection terminal of the inverter module, wherein
   when the switching elements provided in the converter module or in the inverter module perform a switching operation, a DC current flows in the first conductor or in the second conductor.

3. The power conversion device according to claim 1, wherein the capacitor unit is provided at a position facing the positive-side capacitor connection terminal and the negative-side capacitor connection terminal of the converter module, and the positive-side capacitor connection terminal and the negative-side capacitor connection terminal of the inverter module.

4. The power conversion device according to claim 1, wherein the capacitor unit is placed to extend over the converter module and the inverter module through the first conductor and the second conductor.

5. The power conversion device according to claim 1, wherein the capacitor unit is supported by the first conductor and the second conductor.

6. The power conversion device according to claim 1, wherein the capacitor unit is supported by a structure to house the capacitor unit therein, or a support frame provided on a side part of the capacitor unit.

7. The power conversion device according to claim 1, wherein the capacitor unit is provided in such a manner that a terminal forming the one of electrodes of the capacitor cell faces the converter module and the inverter module.

8. The power conversion device according to claim 1, wherein the first conductor and the second conductor are placed in parallel in an outer part of the capacitor unit.

9. The power conversion device according to claim 1, wherein the other electrode of the capacitor cell is electrically connected to the second conductor with a conductor passing through an inner part of the capacitor cell.

10. The power conversion device according to claim 9, wherein the first conductor and the second conductor are placed in parallel in both an inner part and an outer part of the capacitor unit.

11. The power conversion device according to claim 1, wherein
   in a side of the converter module, the first conductor is drawn out from inside to outside of the capacitor unit to constitute a first connection conductor, in a side of the inverter module, the first conductor is drawn out from inside to outside of the capacitor unit to constitute a second connection conductor,
   the first connection conductor is connected directly to the positive-side capacitor connection terminal of the converter module, and the second connection conductor is connected directly to the positive-side capacitor connection terminal of the inverter module,
   in a side of the converter module, the second conductor is drawn out from inside to outside of the capacitor unit to constitute a third connection conductor, in a side of the inverter module, the second conductor is drawn out from inside to outside of the capacitor unit to constitute a fourth connection conductor,
   the third connection conductor is connected directly to the negative-side capacitor connection terminal of the converter module, and the fourth connection conductor is connected directly to the negative-side capacitor connection terminal of the inverter module.

* * * * *